(12) United States Patent
Noguchi et al.

(10) Patent No.: US 12,557,682 B2
(45) Date of Patent: Feb. 17, 2026

(54) MOUNTING DEVICE COMPRISING SEMICONDUCTOR CHIP MOUNTED THROUGH THERMO-COMPRESSION TOOL AND MOUNTING METHOD THEREOF

(71) Applicant: Yamaha Robotics Co., Ltd., Tokyo (JP)

(72) Inventors: Yuichiro Noguchi, Tokyo (JP); Alexander Dzhangirov, Tokyo (JP); Kohei Seyama, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 397 days.

(21) Appl. No.: 18/015,073

(22) PCT Filed: Aug. 5, 2020

(86) PCT No.: PCT/JP2020/029959
§ 371 (c)(1),
(2) Date: Jan. 8, 2023

(87) PCT Pub. No.: WO2022/029916
PCT Pub. Date: Feb. 10, 2022

(65) Prior Publication Data
US 2023/0274951 A1    Aug. 31, 2023

(51) Int. Cl.
*H01L 21/603* (2006.01)
*H01L 21/52* (2006.01)
(Continued)

(52) U.S. Cl.
CPC ............ *H01L 21/603* (2021.08); *H01L 21/52* (2013.01); *H01L 24/08* (2013.01); *H01L 24/24* (2013.01);
(Continued)

(58) Field of Classification Search
CPC ......... H01L 24/08; H01L 24/81; H01L 24/83; H01L 24/742; H01L 24/75;
(Continued)

(56) References Cited

U.S. PATENT DOCUMENTS 10,350,692 B2   7/2019   Seyama et al.
11,123,967 B2   9/2021   Akiba et al.
(Continued)

FOREIGN PATENT DOCUMENTS

CN     104781318    7/2015
JP     2010192615   9/2010
(Continued)

OTHER PUBLICATIONS

"Office Action of Taiwan Counterpart Application" with partial English translation thereof, issued on Jul. 21, 2022, p. 1-p. 12.
(Continued)

*Primary Examiner* — Didarul A Mazumder
(74) *Attorney, Agent, or Firm* — JCIPRNET

(57) ABSTRACT

In this mounting device (10) for mounting a semiconductor chip (100) on a substrate (104), a controller (50) is provided with: a mounter for pressing the semiconductor chip (100) to the substrate (104) in a state where a cover film (110) is interposed between the semiconductor chip (100) and a thermocompression tool (16), and for heating and then cooling the thermocompression tool (16) to mount the semiconductor chip (100) on the substrate (104); and a separator for heating the thermocompression tool (16) after the semiconductor chip (100) has been mounted, and for raising a mounting head (17) to be separated from the cover film (110).

5 Claims, 12 Drawing Sheets

(51) Int. Cl.
  *H01L 21/60*  (2006.01)
  *H01L 23/00*  (2006.01)
(52) U.S. Cl.
  CPC ...... *H01L 24/73* (2013.01); *H01L 2021/6015* (2013.01); *H01L 2224/73204* (2013.01); *H01L 2224/75* (2013.01)
(58) Field of Classification Search
  CPC ......... H01L 2224/75; H01L 2021/6015; H01L 21/603; H01L 21/52; H01L 2224/7555; H01L 2224/75745
  USPC ........................................................ 438/107
  See application file for complete search history.

(56) References Cited

U.S. PATENT DOCUMENTS

| | | | |
|---|---|---|---|
| 11,393,700 B2 | 7/2022 | Seyama et al. | |
| 11,664,344 B2 | 5/2023 | Seyama et al. | |
| 2012/0043005 A1* | 2/2012 | Yamakami | H01L 24/75 156/60 |
| 2016/0254245 A1* | 9/2016 | Wasserman | B23K 3/027 228/180.1 |
| 2020/0388507 A1* | 12/2020 | Seyama | H01L 24/92 |
| 2021/0242051 A1 | 8/2021 | Noguchi et al. | |

FOREIGN PATENT DOCUMENTS

| | | |
|---|---|---|
| JP | 2015035493 | 2/2015 |
| KR | 20150036254 | 4/2015 |
| KR | 20200067191 | 6/2020 |
| TW | 201535635 | 9/2015 |
| TW | 201946161 | 12/2019 |
| WO | 2014003107 | 1/2014 |
| WO | 2018181403 | 10/2018 |
| WO | 2019013300 | 1/2019 |

OTHER PUBLICATIONS

"International Search Report (Form PCT/ISA/210) of PCT/JP2020/029959," mailed on Jun. 10, 2020, with English translation thereof, pp. 1-4.
"Office Action of Korea Counterpart Application", issued on May 17, 2024, with English translation thereof, p. 1-p. 15.
"Patent Rejection Decision of Korea Counterpart Application", with English translation thereof, issued on Jan. 9, 2025, pp. 1-7.
"Office Action of China Counterpart Application", with English translation thereof, issued on Apr. 26, 2025, pp. 1-18.
"Office Action of Singapore Counterpart Application", issued on Aug. 18, 2025, pp. 1-9.

* cited by examiner

Details of part A

Details of part B

Details of part C

MOUNTING DEVICE COMPRISING SEMICONDUCTOR CHIP MOUNTED THROUGH THERMO-COMPRESSION TOOL AND MOUNTING METHOD THEREOF

CROSS-REFERENCE TO RELATED APPLICATION

This application is a 371 application of the International PCT application serial no. PCT/JP2020/029959, filed on Aug. 5, 2020. The entirety of the above-mentioned patent application is hereby incorporated by reference herein and made a part of this specification.

TECHNICAL FIELD

The present invention relates to a structure of a mounting device for mounting a semiconductor chip on a substrate or an object to be mounted, which is another semiconductor chip, via an adhesive material, and relates to a mounting method.

RELATED ART

A conventional flip chip bonder technique is widely known for mounting a semiconductor chip on a substrate or an object to be mounted, which is another semiconductor chip, without using a wire. In the flip chip bonder, an adhesive material composed of thermosetting resin is applied to the object to be mounted in advance, and after the semiconductor chip is heated and pressed by a thermocompression tool to melt the solder on the electrodes and the adhesive material on the object to be mounted is cured, the thermocompression tool is cooled to solidify the solder and join the semiconductor chip to the substrate. In this case, when the semiconductor chip is heated and pressurized by the thermocompression tool, the adhesive material extruded by the semiconductor chip may crawl upward and adhere to the mounting head.

In order to prevent the adhesive material from adhering to the thermocompression tool, a mounting device is disclosed in which the bottom surface of the thermocompression tool is covered with a film member (cover film). For example, Patent Literature 1 describes that a bonding head is provided with a thermocompression tool and a film member transport mechanism for sequentially feeding the film member, and the film member prevents the adhesive material from adhering to the thermocompression tool.

CITATION LIST

Patent Literature

[Patent Literature 1] Japanese Patent Laid-Open No. 2015-35493

SUMMARY OF INVENTION

Technical Problem

However, in the mounting device described in Patent Literature 1, when the semiconductor chip is heated and pressurized by the thermocompression tool at the time of mounting the semiconductor chip on the object to be mounted, the cover film interposed between the thermocompression tool and the semiconductor chip thermally expands. Then, when the thermocompression tool is cooled, the cover film shrinks due to cooling and may adhere to the side surface or the bottom surface of the thermocompression tool. As described above, when the cover film adheres to the side surface or the bottom surface of the thermocompression tool, the cover film may not come off from the thermocompression tool.

Therefore, the present invention makes it easy to separate the thermocompression tool from the cover film after mounting in a mounting device which mounts the semiconductor chip on the object to be mounted via the adhesive material with the cover film interposed between the thermocompression tool and the semiconductor chip.

Solution to Problem

The mounting device according to the present invention is a mounting device for mounting a semiconductor chip on an object to be mounted via an adhesive material. The mounting device includes: a mounting head to which a thermocompression tool and a tool heating/cooling mechanism are attached, in which the thermocompression tool holds the semiconductor chip and moves the semiconductor chip in a direction to contact or be separated from the object to be mounted to press the semiconductor chip to the object to be mounted, and the tool heating/cooling mechanism heats and cools the thermocompression tool; a film arrangement mechanism which moves a cover film to arrange the cover film between the semiconductor chip pressed to the object to be mounted and the thermocompression tool; and a controller which controls movement of the mounting head and the film arrangement mechanism and controls a temperature of the thermocompression tool by the tool heating/cooling mechanism. The controller includes: a mounter which presses the semiconductor chip to the object to be mounted in a state where the cover film is interposed between the semiconductor chip and the thermocompression tool, and heats and then cools the thermocompression tool to mount the semiconductor chip on the object to be mounted; and a separator which heats the thermocompression tool and then raises the mounting head to separate the mounting head from the cover film after mounting the semiconductor chip.

Thus, the mounting device raises the temperature of the thermocompression tool to the predetermined temperature after mounting the semiconductor chip, thermally expands the cover film adhering to the side surface or the bottom surface of the thermocompression tool when mounting the semiconductor chip to reduce the adhesive force to the side surface or the bottom surface of the thermocompression tool, and then raises the mounting head. Therefore, it is possible to easily separate the thermocompression tool from the cover film when raising the mounting head.

In the mounting device of the present invention, the separator may heat the thermocompression tool to a predetermined temperature by the tool heating/cooling mechanism in a state of slightly raising the mounting head after the semiconductor chip is mounted on the object to be mounted, and then raise the mounting head.

Thus, it is possible to reduce the temperature rise of the mounted semiconductor chip and the cured adhesive material when raising the temperature of the thermocompression tool with a slight gap between the thermocompression tool and the cover film, and it is possible to suppress deterioration and damage of the mounted semiconductor chip and the adhesive material.

In the mounting device of the present invention, the thermocompression tool may suck and hold the semiconductor chip, and the mounter may suck and hold the semiconductor chip on the thermocompression tool, and lower the mounting head to temporarily pressure-bond the semiconductor chip onto the object to be mounted via the adhesive material, and interpose the cover film between the semiconductor chip and the thermocompression tool, and press the temporarily pressure-bonded semiconductor chip to mount the semiconductor chip on the object to be mounted.

Thus, it is possible to mount the semiconductor chip without providing a ventilation hole in the cover film as described in Patent Literature 1, and the tact time can be shortened.

The mounting method according to the present invention is a mounting method for mounting a semiconductor chip on an object to be mounted via an adhesive material. The mounting method includes: a preparation step of preparing a mounting device including: a mounting head which has a tip attached with a thermocompression tool that holds the semiconductor chip and moves the semiconductor chip in a direction to contact or be separated from the object to be mounted to press the semiconductor chip to the object to be mounted, a tool heating/cooling mechanism which is attached to the mounting head to heat and cool the thermocompression tool, and a film arrangement mechanism which arranges a cover film between the semiconductor chip and the thermocompression tool; a film arrangement step of interposing the cover film between the semiconductor chip and the thermocompression tool by the film arrangement mechanism when the semiconductor chip is mounted on the object to be mounted; a mounting step of pressing the semiconductor chip to the object to be mounted in a state where the cover film is interposed between the semiconductor chip and the thermocompression tool, and heating and then cooling the thermocompression tool to mount the semiconductor chip on the object to be mounted; and a separation step of heating the thermocompression tool and then raising the mounting head to separate the mounting head from the cover film after the mounting step.

Effects of Invention

The present invention can easily separate the thermocompression tool from the cover film after mounting in the mounting device which mounts the semiconductor chip on the object to be mounted via the adhesive material with the cover film interposed between the thermocompression tool and the semiconductor chip.

DESCRIPTION OF EMBODIMENTS

Figure 1:
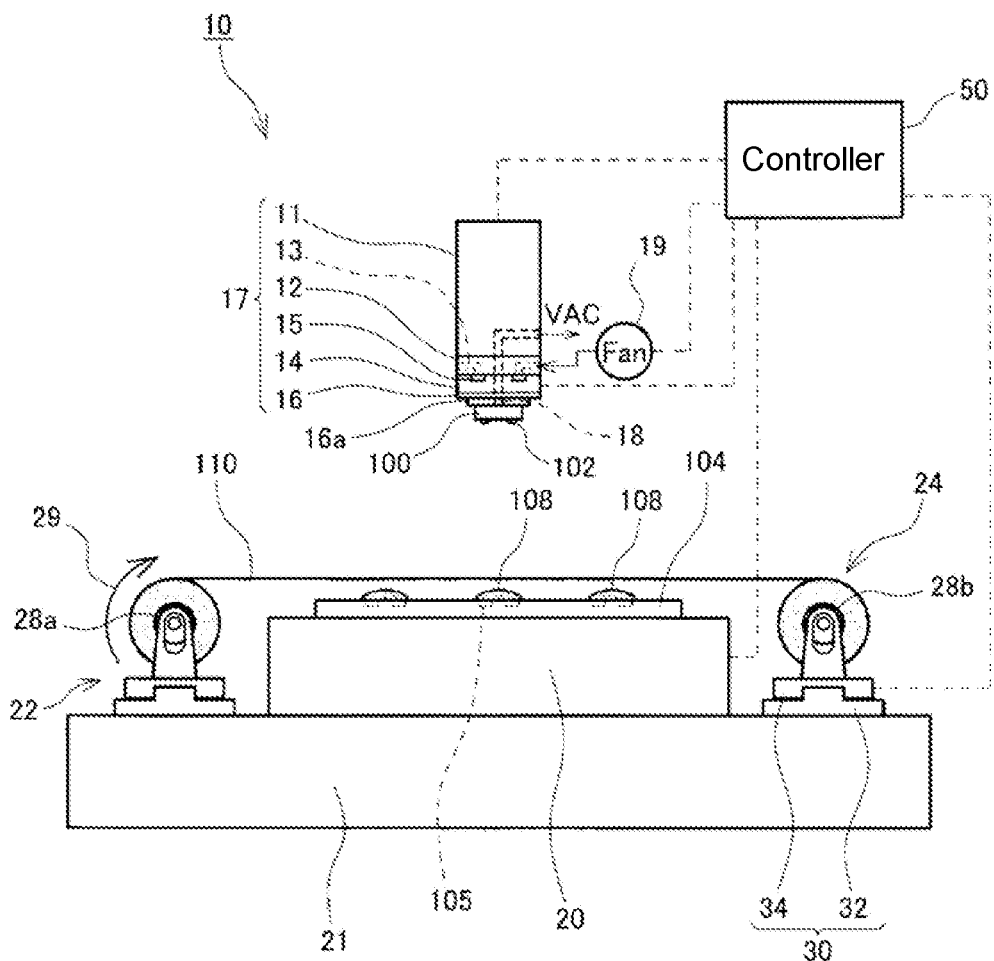
FIG. 1 is a system diagram showing the configuration of the mounting device of the embodiment.

Hereinafter, a mounting device 10 according to an embodiment will be described with reference to the drawings. As shown in FIG. 1, the mounting device 10 is a device that manufactures a semiconductor device by mounting a plurality of semiconductor chips 100 on a substrate 104 which is an object to be mounted. The semiconductor chip 100 is mounted on the substrate 104 by flip chip bonder technology. Specifically, after protrusions composed of a conductive material, called bumps 102, are formed on the bottom surface of each semiconductor chip 100, the semiconductor chip 100 is inverted and the bumps 102 are joined to electrodes 105 formed on the surface of the substrate 104, so that the semiconductor chip 100 and the substrate 104 are electrically connected.

Figure 2:
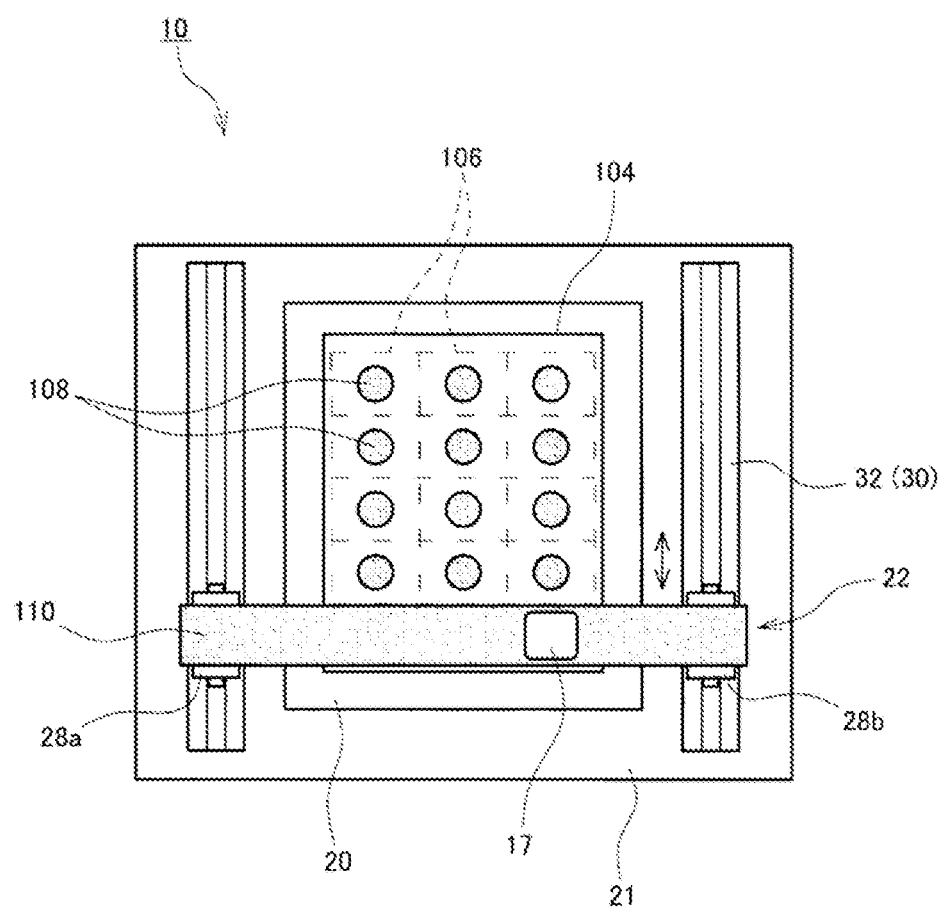
FIG. 2 is a schematic plan view of the mounting device of the embodiment.

As shown in FIG. 2, on the substrate 104, mounting sections 106 for mounting the semiconductor chips 100 are defined in a two-dimensional array. In the illustrated example, 15 mounting sections 106 are defined in 3 rows and 5 columns on one substrate 104. A plurality of electrodes 105 electrically connected to the bumps 102 of the semiconductor chip 100 are formed on the surface of each mounting section 106. Further, each mounting section 106 is previously coated with an adhesive material 108 that is called a non-conductive paste (NCP) or a non-conductive film (NCF). The adhesive material 108 is composed of thermosetting resin having both insulating properties and thermosetting properties. By placing the semiconductor chip 100 on the adhesive material 108 and pressing the semiconductor chip 100 against the substrate 104 and heating the semiconductor chip 100, the adhesive material 108 is cured, and the semiconductor chip 100 is mechanically bonded and fixed to the substrate 104. The method of coating the adhesive material 108 on the substrate 104 in advance in this way is generally called a "pre-coating method."

The mounting device 10 temporarily pressure-bonds and then mounts each semiconductor chip 100 on the substrate 104. The temporary pressure-bonding is to temporarily place the semiconductor chip 100 in the corresponding mounting section 106 (adhesive material 108) of the substrate 104. Further, the mounting is to mechanically and electrically connect the semiconductor chip 100 to the substrate 104 by heating and pressurizing the temporarily pressure-bonded semiconductor chip 100. At the time of mounting, the semiconductor chip 100 is heated at a temperature equal to or higher than the curing temperature of the adhesive material 108 and equal to or higher than the melting temperature of the bump 102. In this example, after the temporary pressure-bonding of the semiconductor chip 100 is continuously executed in a plurality of mounting sections 106, the mounting of a plurality of temporarily pressure-bonded semiconductor chips 100 is continuously executed.

The mounting device 10 is a device for mounting the semiconductor chip 100 on the substrate 104 by the above-mentioned procedure. The mounting device 10 includes a bonding stage 20, a mounting head 17, a base 21, a film arrangement mechanism 22, and a controller 50 that controls the movement of each of these parts.

The bonding stage 20 is a stage on which the substrate 104 is placed. The bonding stage 20 is provided with, for example, a suction hole (not shown) for sucking and holding the substrate 104, a heater for heating the substrate 104 (not shown), etc. The bonding stage 20 is supported by the base 21.

The mounting head 17 is provided so as to face the bonding stage 20, and includes a main body 11, a heat insulating block 12 attached to the lower side of the main body 11, a heater 14 attached to the lower side of the heat insulating block 12, and a thermocompression tool 16 attached to the lower side of the heater 14.

The main body 11 can be moved in the vertical direction to be brought into contact with and separated from the substrate 104 sucked onto the bonding stage 20, and can also be moved in the horizontal direction with respect to the substrate 104 by a drive mechanism provided inside.

The heat insulating block 12 is a ceramic plate-shaped member that is sandwiched between the main body 11 and the heater 14 to prevent the heat of the heater 14 from being transferred to the main body 11. The heater 14 is formed by embedding a heat-generating resistor made of platinum, tungsten, or the like inside ceramics such as aluminum nitride.

On the upper surface of the heater 14, two cooling grooves 15 extending in the direction perpendicular to the paper surface of FIG. 1 are provided. Further, the heat insulating block 12 is provided with an air flow path 13 extending in an L shape from the side surface and communicating the side surface and the cooling grooves 15 provided in the heater 14. When electric power is input from the controller 50, the heat-generating resistor generates heat and the temperature rises, and the heater 14 heats the thermocompression tool 16 attached to the lower side of the heater 14. Further, when the air from a fan 19 flows through the air flow path 13 of the heat insulating block 12, the heater 14 is cooled, whereby the thermocompression tool 16 is cooled. Therefore, the heat insulating block 12, the heater 14, and the fan 19 form a tool heating/cooling mechanism for heating and cooling the thermocompression tool 16.

The thermocompression tool 16 has an upper surface having substantially the same size as the heater 14, and is provided with a protrusion 16a on the lower side for sucking and pressing the semiconductor chip 100. The size of the protrusion 16a is substantially the same as the size of the semiconductor chip 100. The thermocompression tool 16 is made of ceramics. The thermocompression tool 16 is formed with a suction hole 18 for sucking and holding the semiconductor chip 100. The suction hole 18 penetrates the heater 14 and the heat insulating block 12 and communicates with a suction pump (not shown) from the main body 11, and due to the negative pressure generated by the suction pump, the semiconductor chip 100 is sucked and held on the lower surface of the protrusion 16a of the thermocompression tool 16.

A film arrangement mechanism 22 for interposing a cover film 110 between the temporarily pressure-bonded semiconductor chip 100 and the thermocompression tool 16 at the time of mounting the semiconductor chip 100 is installed on the base 21 of the mounting device 10. In this example, a strip-shaped cover film 110 that is long in one direction is used. A material having excellent heat resistance and high separability of the adhesive material 108 is suitable as the material of the cover film 110. Therefore, as the material of the cover film 110, for example, fluororesin such as polytetrafluoroethylene (PTFE) and tetrafluoroethylene/perfluoroalkyl vinyl ether copolymer (PFA) can be used.

The film arrangement mechanism 22 has a film delivery mechanism 24 that sequentially delivers the strip-shaped cover film 110 above the substrate 104. The film delivery mechanism 24 includes a delivery roller 28a and a take-up roller 28b provided on both sides of the bonding stage 20 (hereinafter, the delivery roller 28a and the take-up roller 28b are simply referred to as "feed rollers 28" when not distinguished from each other). The cover film 110 is hung between the pair of feed rollers 28. As the delivery roller 28a rotates in a predetermined delivery direction (direction of the arrow 29 in FIG. 1), the new cover film 110 is sequentially delivered. The take-up roller 28b rotates in the same direction as the delivery roller 28a in conjunction with the delivery roller 28a, so that the used cover film 110 is taken up by the take-up roller 28b and collected. In other words, the cover film 110 is fed by rotating the pair of feed rollers 28 in the same direction.

The film arrangement mechanism 22 further includes a film movement mechanism 30 that moves the cover film 110 in the horizontal direction together with the film delivery mechanism 24. The film movement mechanism 30 has a pair of rails 32 extending in the first direction (in the illustrated example, the long direction of the rectangular substrate 104), and a moving block 34 that slides and moves along the rails 32. Further, the film arrangement mechanism 22 includes a film elevating mechanism (not shown) for elevating and lowering the cover film 110 together with the film delivery mechanism 24. The film elevating mechanism is not particularly limited as long as the film elevating mechanism can change the height of the feed rollers 28.

The controller 50 is connected to the main body 11 of the mounting head 17, the heater 14, the fan 19, the film arrangement mechanism 22, and the bonding stage 20 to control the movement of the mounting head 17 and the film arrangement mechanism 22 and the temperature of the thermocompression tool 16 by the heater 14 and the fan 19. The controller 50 includes, for example, a CPU that performs various operations and a memory that stores various data and programs. Detection results from various sensors are input to the controller 50, and the controller 50 performs drive control and temperature control of each part according to the detection results. For example, the controller 50 performs the movement control of the mounting head 17, the temperature control of the thermocompression tool 16 and the bonding stage 20, and the drive control of the suction mechanism. The controller 50 also performs the movement control of the film arrangement mechanism 22 in order to arrange the cover film 110 at an appropriate position.

Hereinafter, the operation of the mounting device 10 of the embodiment will be described with reference to FIG. 3 to FIG. 14. When the semiconductor chip 100 is mounted, the substrate 104 is placed on the bonding stage 20. As shown in FIG. 2, the adhesive material 108 is coated on the mounting section 106 of the substrate 104 in advance or after the substrate 104 is placed on the bonding stage 20.

The controller 50 causes the semiconductor chip 100 to be temporarily pressure-bonded to each mounting section 106 of the substrate 104. Specifically, the controller 50 moves the mounting head 17 to a chip supply source (not shown), and causes the protrusion 16a of the thermocompression tool 16 attached to the tip to suck and hold the semiconductor chip 100. Then, the controller 50 drives the main body 11 of the mounting head 17 to move the mounting head 17 directly above the corresponding mounting section 106.

Figure 3:
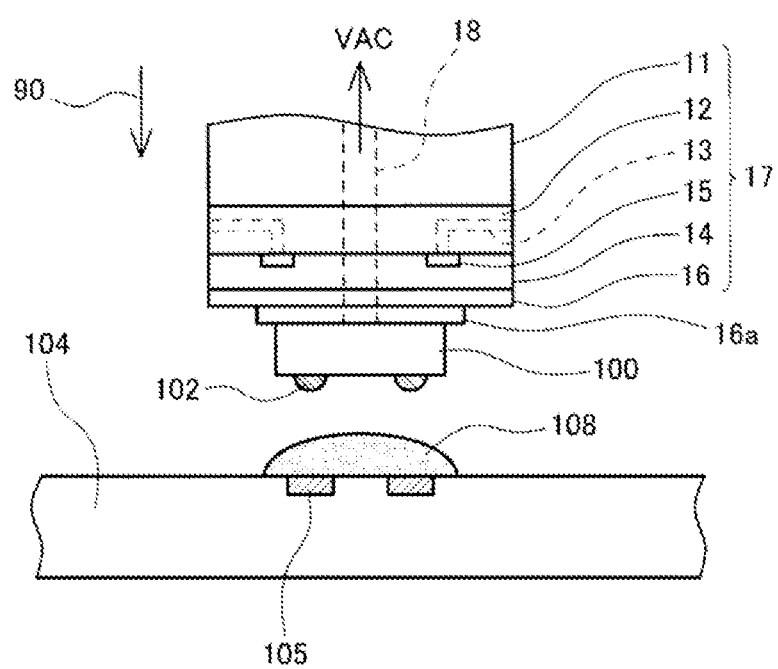
FIG. 3 is a side view showing the operation of temporary pressure-bonding of the semiconductor chip.

Thereafter, as shown in FIG. 3, the controller 50 lowers the mounting head 17 toward the substrate 104 as shown by the arrow 90, and presses the semiconductor chip 100 sucked and held by the protrusion 16a of the thermocompression tool 16 at the tip onto the corresponding mounting section 106 (and thus the adhesive material 108). As a result, the semiconductor chip 100 is temporarily pressure-bonded onto the substrate 104 and the adhesive material 108. If one semiconductor chip 100 can be temporarily pressure-bonded, the mounting head 17 releases the suction of the semiconductor chip 100 and then rises. Thereafter, the mounting head 17 sequentially performs temporary pressure-bonding for all the semiconductor chips 100 in the same procedure.

During the temporary pressure-bonding process, the controller 50 drives the film movement mechanism 30 to move the cover film 110 to a retracted position. The retracted position is a position separated in the horizonal direction from the mounting section 106 to which the semiconductor chip 100 is temporarily pressure-bonded.

Figure 4:
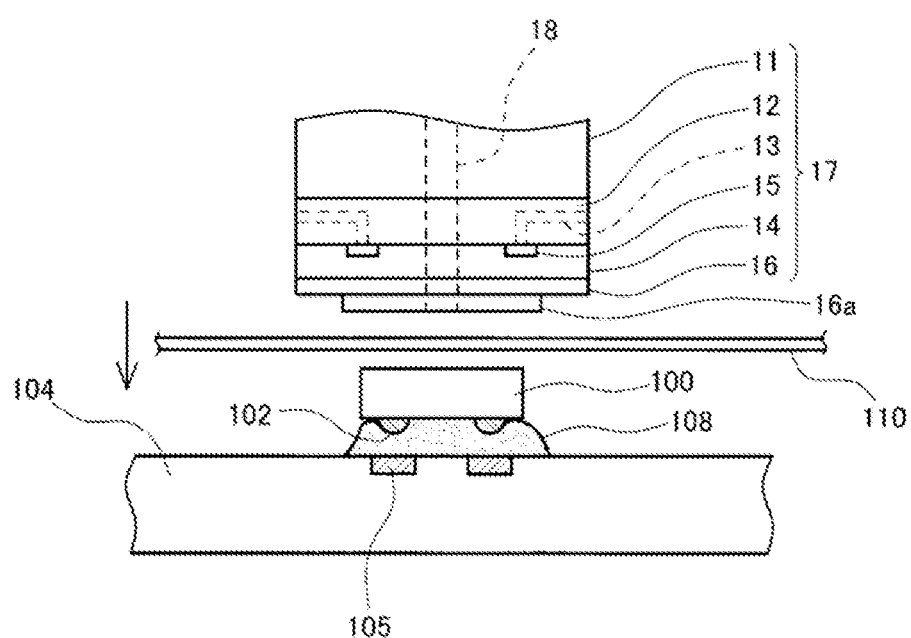
FIG. 4 is a side view showing a state in which the cover film is interposed between the temporarily pressure-bonded semiconductor chip and the thermocompression tool.

After the temporary pressure-bonding process is completed, the controller 50 executes a film arrangement step. As shown in FIG. 4, the controller 50 drives the film movement mechanism 30 to move the cover film 110 in the horizontal direction to a position between the semiconductor chip 100 and the thermocompression tool 16 directly above the semiconductor chip 100 that has been temporarily pressure-bonded. Then, the controller 50 lowers the cover film 110 by the film elevating mechanism so that the cover film 110 is at a position at substantially the same height as the upper surface of the semiconductor chip 100.

Figure 5:
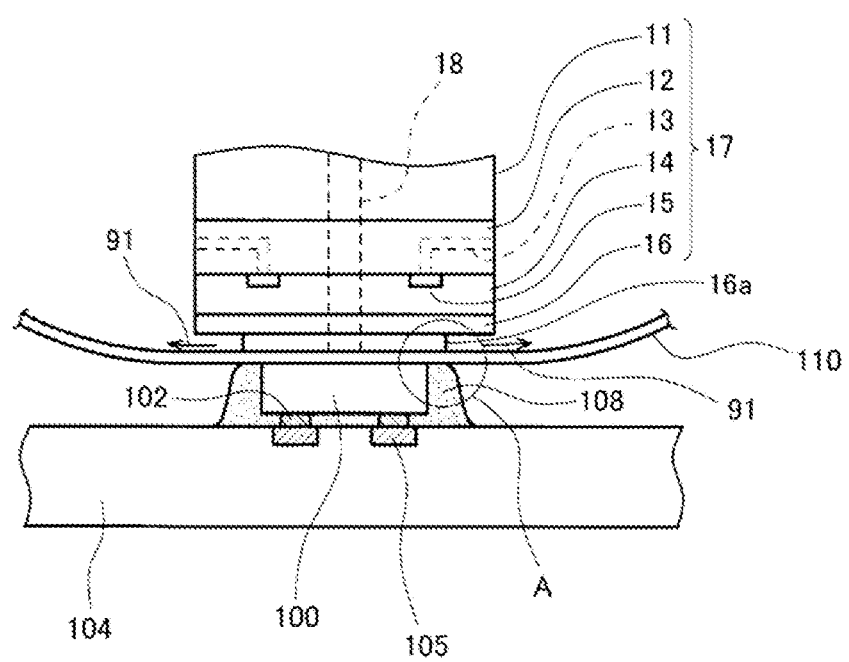
FIG. 5 is a side view showing the temperature raising operation at the time of mounting the semiconductor chip.
Figure 14:
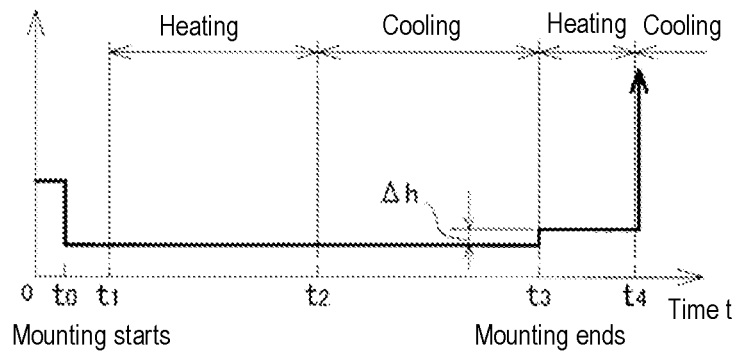
FIG. 14 is a graph showing the change in the height of the thermocompression tool.

The controller 50 starts a mounting step at time to in FIG. 14. The controller 50 lowers the main body 11 of the mounting head 17 at time to in FIG. 14, and as shown in FIG. 5, starts to press the semiconductor chip 100 that has been temporarily pressure-bonded by the protrusion 16a of the thermocompression tool 16 from above the cover film 110. By pressing, the adhesive material 108 protrudes around the semiconductor chip 100, and a part of the adhesive material 108 crawls up the side surface of the semiconductor chip 100 and reaches the lower surface of the cover film 110. Further, by pressing, the bump 102 formed on the semiconductor chip 100 comes into contact with the electrode 105 of the substrate 104.

Figure 12:
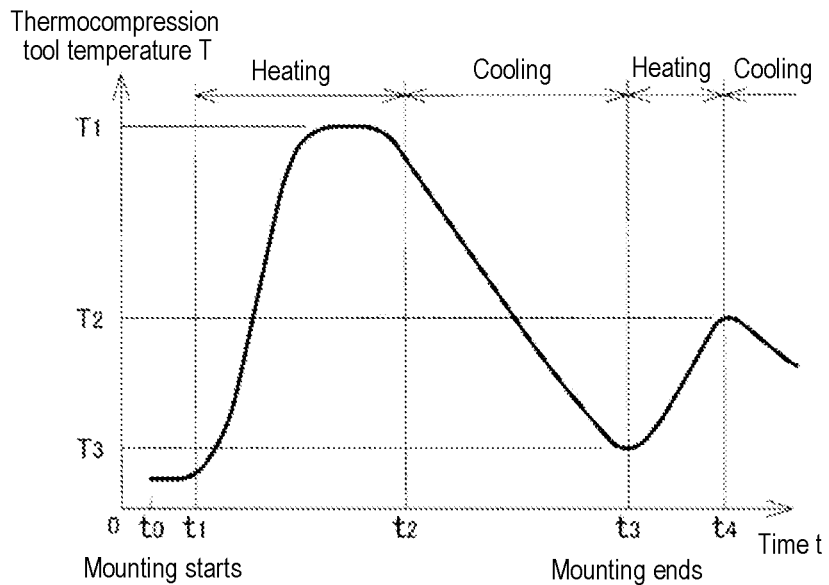
FIG. 12 is a graph showing the temperature change of the thermocompression tool.
Figure 13:
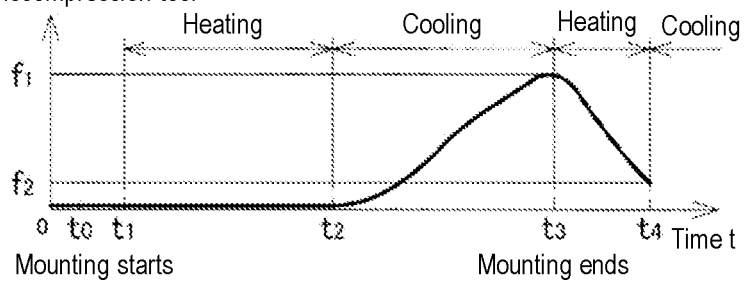
FIG. 13 is a graph showing the change in the adhesion force of the cover film to the thermocompression tool.

The controller 50 starts supplying electric power to the heater 14 at time t1 shown in FIG. 12 to raise the temperature of the thermocompression tool 16 by the heater 14. When the temperature of the thermocompression tool 16 rises, the semiconductor chip 100 is heated by the heat and the adhesive material 108 is softened. When the temperature is further raised to reach or exceed the melting temperature of the bump 102, the bump 102 of the semiconductor chip 100 is melted. At this time, as shown in FIG. 14, the controller 50 controls the height of the mounting head 17 so that the height of the semiconductor chip 100 from the substrate 104 is constant at the height after mounting. Further, when the temperature rises to the curing temperature of the adhesive material 108, the adhesive material 108 starts to be thermally cured. In this way, the controller 50 heats the thermocompression tool 16 to a temperature T1 that is equal to or higher than the curing temperature of the adhesive material 108 and equal to or higher than the melting temperature of the bump 102. The temperature T1 may be, for example, about 300° C.

Figure 6:
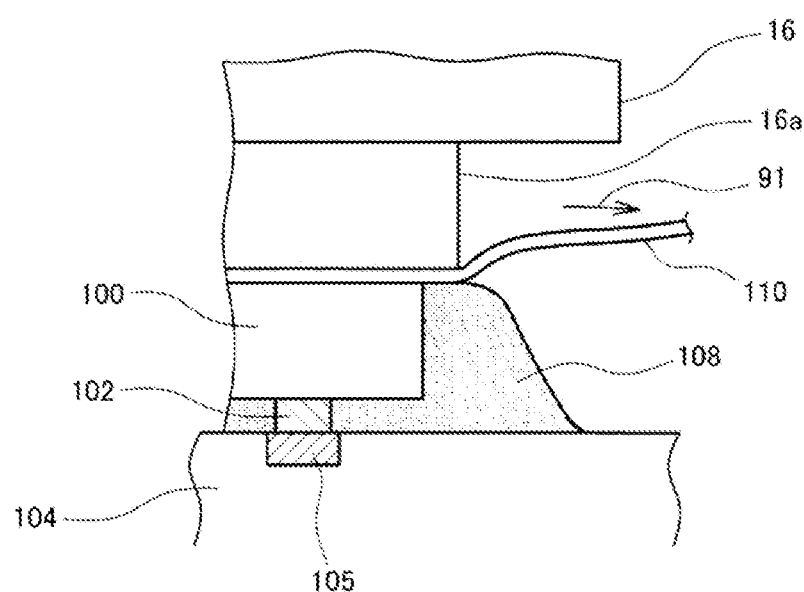
FIG. 6 is a side view showing the details of the part A of FIG. 5.

During the temperature raising process, the cover film 110 thermally expands outward from the thermocompression tool 16 as shown by the arrows 91 shown in FIG. 5 and FIG. 6 due to the heating of the thermocompression tool 16. Further, the cover film 110 is deformed so as to be slightly recessed downward by pressing. Therefore, as shown in FIG. 6, the cover film 110 is deformed so as to extend diagonally upward from the corner of the bottom surface of the protrusion 16a of the thermocompression tool 16.

Figure 7:
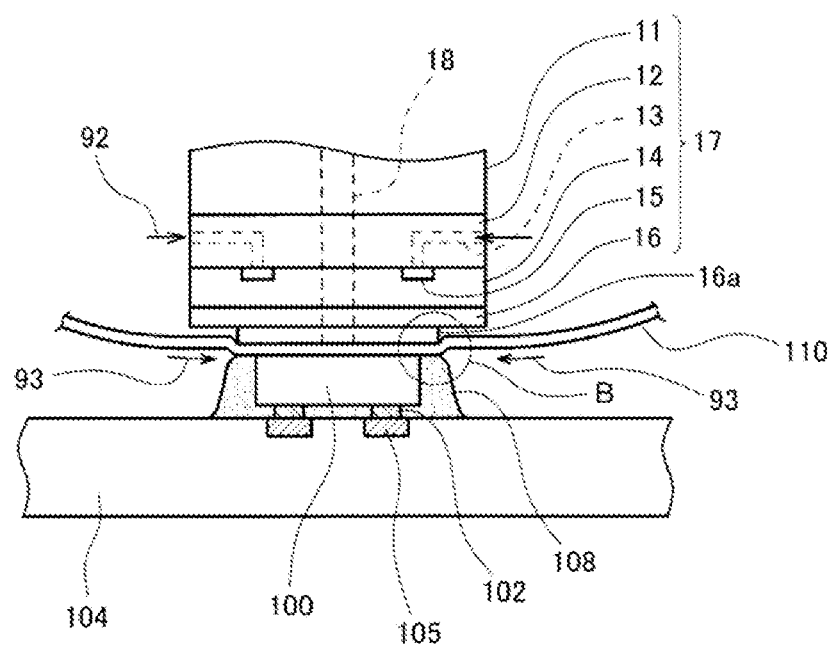
FIG. 7 is a side view showing the cooling operation at the time of mounting the semiconductor chip.

The controller 50 starts the fan 19 at time t2 in FIG. 12 to start flowing cooling air to the air flow path 13 of the heat insulating block 12 as shown by the arrow 92 in FIG. 7. The cooling air flows from the air flow path 13 through the cooling groove 15 of the heater 14, and flows out from the cooling groove 15 in the direction perpendicular to the paper surface of FIG. 7. As a result, the heater 14 is cooled and the temperature is lowered, the temperature of the thermocompression tool 16 is also lowered accordingly, the molten bump 102 is hardened, and the bonding with the electrode 105 of the substrate 104 is completed at time t3. In addition, the temperature of the thermoset adhesive material 108 is also lowered. As a result, the controller 50 ends the mounting step.

When the temperature of the thermocompression tool 16 decreases due to the cooling of the thermocompression tool 16 during the mounting step, the temperature of the cover film 110 also decreases. Then, in FIG. 6, the portion extending diagonally upward from the corner of the bottom surface of the protrusion 16a of the thermocompression tool 16 shrinks due to cooling toward the side surface of the protrusion 16a of the thermocompression tool 16 as shown by the arrows 93 in FIG. 7 and FIG. 8. Then, as the cooling progresses, the portion adheres to the side surface or the bottom surface of the protrusion 16a of the thermocompression tool 16. The adhesive force f gradually increases from time t2 to time t3 in FIG. 13, and the adhesive force f reaches f3 at time t3. In this way, when the cover film 110 adheres to the side surface or the bottom surface of the protrusion 16a of the thermocompression tool 16, the cover film 110 may not come off from the thermocompression tool 16 as the mounting head 17 is raised.

The controller 50 causes the cooling air from the fan 19 to flow through the air flow path 13 to cool the heater 14, thereby cooling the thermocompression tool 16. Then, if the temperature of the thermocompression tool 16 decreases to the temperature T3 at time t3 shown in FIG. 12, the controller 50 stops the fan 19 to stop the flow of the cooling air into the air flow path 13. As a result, the mounting of the semiconductor chip 100 is completed. The temperature T3 may be, for example, equal to or lower than the temperature at which the adhesive material 108 starts to soften. As a result, when the semiconductor chip 100 is sucked and held on the protrusion 16a of the thermocompression tool 16 and temporarily pressure-bonded onto the adhesive material 108, the adhesive material 108 is softened so as to prevent the position of the temporarily pressure-bonded semiconductor chip 100 from shifting.

As shown in FIG. 14, the controller 50 controls the height of the mounting head 17 so that the height of the thermocompression tool 16 is constant from time to when the mounting starts to time t3 when the mounting of the semiconductor chip 100 ends. The controller 50 starts a separation step at time t3 in FIG. 14 when the mounting step is completed. The controller 50 drives the main body 11 of the mounting head 17 at time t3 to slightly raise the height of the thermocompression tool 16 by a height Δh and maintain the height.

Figure 9:
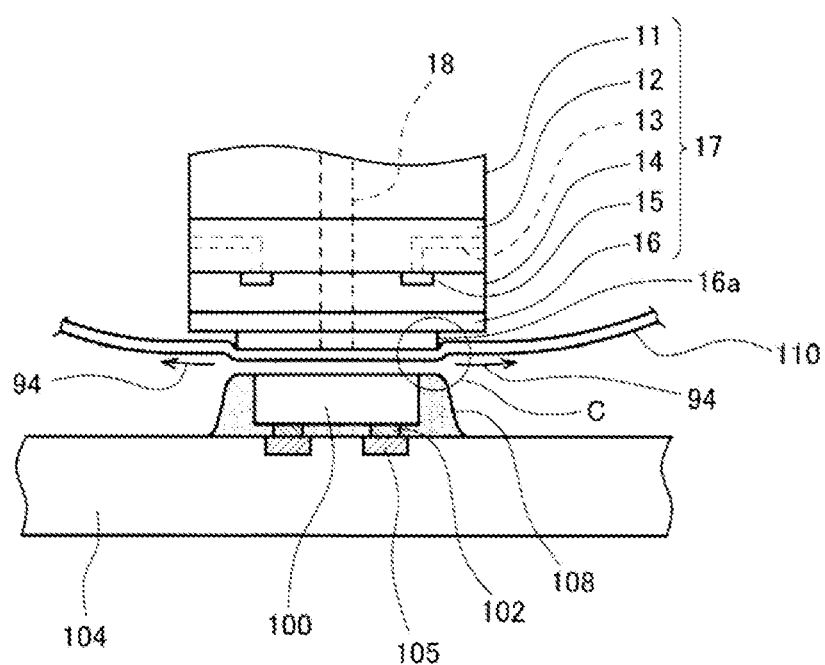
FIG. 9 is a side view showing the temperature raising operation after mounting.
Figure 10:
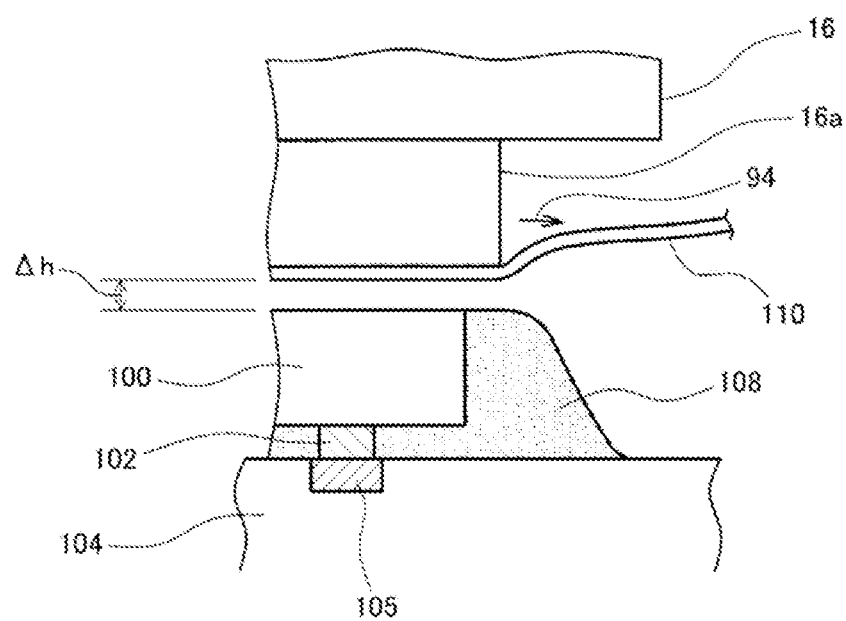
FIG. 10 is a side view showing the details of the part C shown in FIG. 9.

As shown in FIG. 9, when the height of the thermocompression tool 16 is increased by Δh, the cover film 110 adhering to the side surface or the bottom surface of the protrusion 16a of the thermocompression tool 16 slightly rises together with the thermocompression tool 16 while adhering to the side surface or the bottom surface of the protrusion 16a of the thermocompression tool 16. Then, a slight gap is formed between the cover film 110 and the upper surface of the semiconductor chip 100 that has been mounted.

Figure 8:
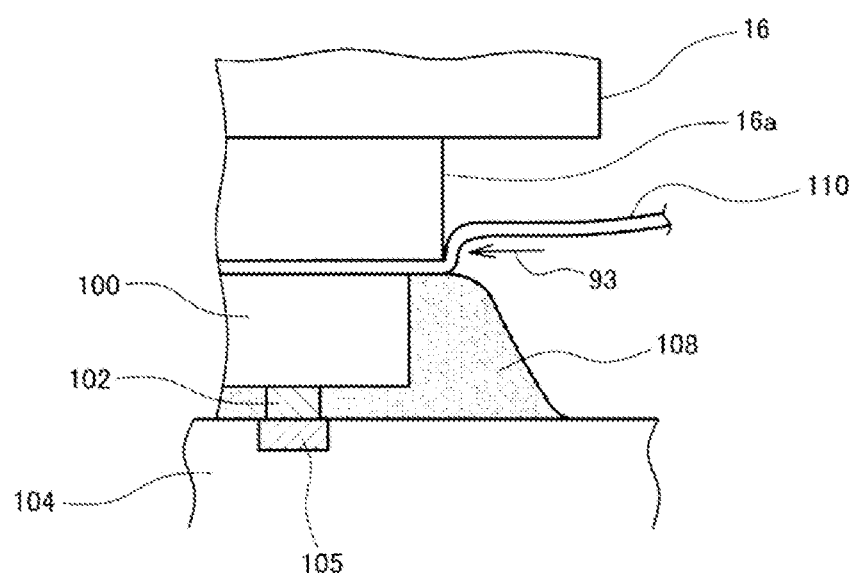
FIG. 8 is a side view showing the details of the part B of FIG. 7.

The controller 50 supplies electric power to the heater 14 at time t3 in FIG. 12 while maintaining the height of the thermocompression tool 16 to raises the temperature of the thermocompression tool 16 to a predetermined temperature T2 by the heater 14. As a result, as shown in FIG. 8, the cover film 110 adhering to the side surface or the bottom surface of the protrusion 16a of the thermocompression tool 16 thermally expands and is separated from the side surface or the bottom surface of the protrusion 16a as shown by the arrow 94 shown in FIG. 9 and FIG. 10. Then, as the temperature of the thermocompression tool 16 rises as shown from time t3 to time t4 in FIG. 12 and FIG. 13, the adhesive force f of the cover film 110 to the thermocompression tool 16 decreases. Then, when the temperature of the thermocompression tool 16 rises to the predetermined temperature T2 at time t4, the adhesive force f of the cover film 110 decreases to f2.

Figure 11:
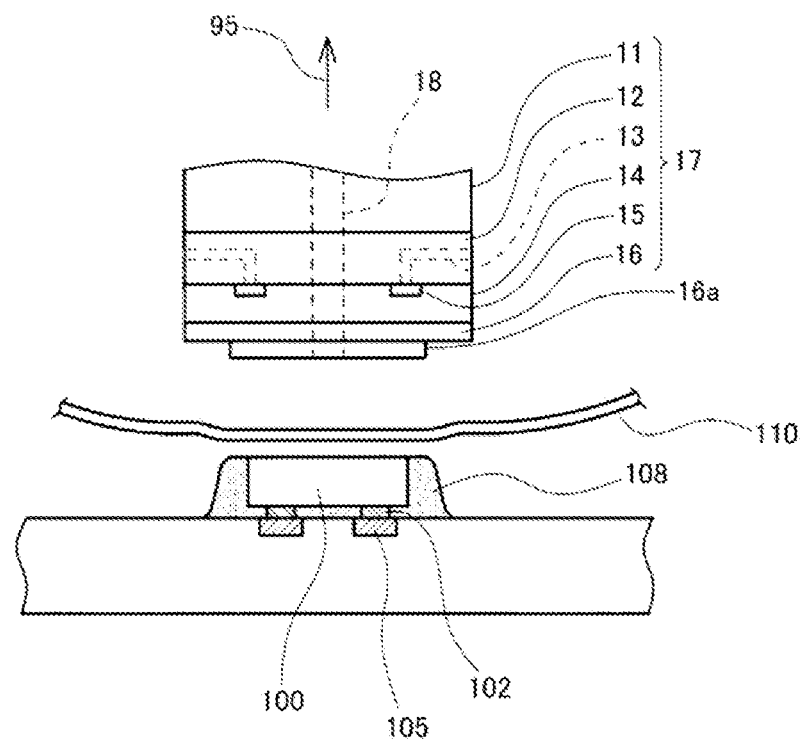
FIG. 11 is a side view showing a state in which the mounting head is raised after the temperature raising operation.

When the temperature of the thermocompression tool 16 reaches the predetermined temperature T2, the controller 50 stops the supply of electric power to the heater 14 at time t4 to drive the main body 11 of the mounting head 17 and raise the mounting head 17 as shown by the arrow 95 shown in FIG. 11. At this time, the cover film 110 spanned between the pair of feed rollers 28 does not rise at the same position and the adhesive force f to the thermocompression tool 16 decreases to f2. Therefore, the thermocompression tool 16 is separated from the cover film 110 and rises together with the main body 11. As a result, the separation step is completed.

After raising the mounting head 17, the controller 50 starts the fan 19 again to cool the heater 14 and the thermocompression tool 16 to the temperature T3.

Here, the predetermined temperature T2 can be set freely as long as it is a temperature at which the adhesive force f of the cover film 110 can be reduced to the extent that the cover film 110 is separated from the thermocompression tool 16 when the mounting head 17 is raised. For example, the temperature T2 may be set to about 50% of the temperature T1 or may be set to about 150° C. to 200° C.

As described above, the mounting device 10 of the embodiment raises the temperature of the thermocompression tool 16 to the predetermined temperature T2 after mounting the semiconductor chip 100, thermally expands the cover film 110 adhering to the side surface or the bottom surface of the thermocompression tool 16 when mounting the semiconductor chip 100 to reduce the adhesive force f to the side surface or the bottom surface of the thermocompression tool 16, and then raises the mounting head 17. Therefore, it is possible to easily separate the thermocompression tool 16 from the cover film 110 when raising the mounting head 17.

Further, the mounting device 10 of the embodiment slightly raises the mounting head 17 after mounting the semiconductor chip 100 and raises the temperature of the thermocompression tool 16 with a slight gap between the thermocompression tool 16 and the cover film 110. Therefore, it is possible to reduce the temperature rise of the mounted semiconductor chip 100 and the cured adhesive material 108 when raising the temperature of the thermocompression tool 16, and suppress deterioration and damage of the mounted semiconductor chip 100 and the adhesive material 108. In addition, since the heat of the heater 14 is not transferred to the semiconductor chip 100 and the adhesive material 108, the temperatures of the thermocompression tool 16 and the cover film 110 can be raised to the predetermined temperature T2 in a short time. Therefore, it is possible to easily separate the thermocompression tool 16 from the cover film 110 while preventing the tact time from becoming long.

Further, the mounting device 10 of the embodiment causes the semiconductor chip 100 to be sucked and held by the thermocompression tool 16 to temporarily pressure-bond the semiconductor chip 100 onto the adhesive material 108 on the substrate 104, and then heats and presses the semiconductor chip 100 with the cover film 110 interposed between the temporarily pressure-bonded semiconductor chip 100 and the thermocompression tool 16 to mount the semiconductor chip 100 on the substrate 104. Therefore, unlike the conventional mounting device described in Patent Literature 1, it is not necessary to provide a ventilation hole in the cover film 110, and the tact time can be shortened as compared with the conventional mounting device.

In the mounting device 10, the temperature of the thermocompression tool 16 may be raised without raising the mounting head 17 after mounting the semiconductor chip 100. In this case, as described above, it is also possible to reduce the adhesive force f by the thermal expansion of the cover film 110 to easily separate the thermocompression tool 16 from the cover film 110. However, in this case, the predetermined temperature T2 may be lower than the previous example, for example, about 100° C. to 150° C. so as to suppress thermal deterioration of the mounted semiconductor chip 100 and the cured adhesive material 108.

The above description illustrates that the mounting device 10 mounts the semiconductor chip 100 on the substrate 104, but the present invention is not limited thereto, and the semiconductor chip 100 can be mounted on another semiconductor chip 100. In that case, another semiconductor chip 100 constitutes an object to be mounted similar to the substrate 104.

What is claimed is:

1. A mounting device for mounting a semiconductor chip on an object to be mounted via an adhesive material, the mounting device comprising:
   a mounting head to which a thermocompression tool and a tool heating/cooling mechanism are attached, wherein the thermocompression tool holds the semiconductor chip and moves the semiconductor chip in a direction to contact or be separated from the object to be mounted to press the semiconductor chip to the object to be mounted, and the tool heating/cooling mechanism heats and cools the thermocompression tool;
   a film arrangement mechanism which moves a cover film to arrange the cover film between the semiconductor chip pressed to the object to be mounted and the thermocompression tool; and
   a controller which controls movement of the mounting head and the film arrangement mechanism and controls a temperature of the thermocompression tool by the tool heating/cooling mechanism,
   wherein the controller comprises:
   a mounter which presses the semiconductor chip to the object to be mounted in a state where the cover film is interposed between the semiconductor chip and the thermocompression tool, heats the thermocompression tool to a first temperature and then cools the thermocompression tool to mount the semiconductor chip on the object to be mounted; and a separator which heats the thermocompression tool to a predetermined temperature lower than the first temperature and then raises the mounting head to separate the mounting head from the cover film after mounting the semiconductor chip.

2. The mounting device according to claim 1, wherein the separator heats the thermocompression tool to the predetermined temperature by the tool heating/cooling mechanism in a state of slightly raising the mounting head after the semiconductor chip is mounted on the object to be mounted, and then raises the mounting head.

3. The mounting device according to claim 1, wherein the thermocompression tool sucks and holds the semiconductor chip, the mounter sucks and holds the semiconductor chip on the thermocompression tool, and lowers the mounting head to temporarily pressure-bond the semiconductor chip onto the object to be mounted via the adhesive material, and interposes the cover film between the semiconductor chip and the thermocompression tool, and presses the temporarily pressure-bonded semiconductor chip to mount the semiconductor chip on the object to be mounted.

4. A mounting method for mounting a semiconductor chip on an object to be mounted via an adhesive material, the mounting method comprising:

a preparation step of preparing a mounting device comprising: a mounting head which has a tip attached with a thermocompression tool that holds the semiconductor chip and moves the semiconductor chip in a direction to contact or be separated from the object to be mounted to press the semiconductor chip to the object to be mounted, a tool heating/cooling mechanism which is attached to the mounting head to heat and cool the thermocompression tool, and a film arrangement mechanism which arranges a cover film between the semiconductor chip and the thermocompression tool;

a film arrangement step of interposing the cover film between the semiconductor chip and the thermocompression tool by the film arrangement mechanism when the semiconductor chip is mounted on the object to be mounted;

a mounting step of pressing the semiconductor chip to the object to be mounted in a state where the cover film is interposed between the semiconductor chip and the thermocompression tool, heating the thermocompression tool to a first temperature and then cooling the thermocompression tool to mount the semiconductor chip on the object to be mounted; and a separation step of heating the thermocompression tool to a predetermined temperature lower than the first temperature and then raising the mounting head to separate the mounting head from the cover film after the mounting step.

5. The mounting device according to claim 2, wherein the thermocompression tool sucks and holds the semiconductor chip, the mounter sucks and holds the semiconductor chip on the thermocompression tool, and lowers the mounting head to temporarily pressure-bond the semiconductor chip onto the object to be mounted via the adhesive material, and interposes the cover film between the semiconductor chip and the thermocompression tool, and presses the temporarily pressure-bonded semiconductor chip to mount the semiconductor chip on the object to be mounted.

* * * * *